(12) United States Patent
Wang

(10) Patent No.: US 9,129,994 B2
(45) Date of Patent: Sep. 8, 2015

(54) FIN FIELD EFFECT TRANSISTOR AND FABRICATION METHOD

(71) Applicant: Semiconductor Manufacturing International Corp., Shanghai (CN)

(72) Inventor: Wenbo Wang, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 0 days.

(21) Appl. No.: 13/777,142

(22) Filed: Feb. 26, 2013

(65) Prior Publication Data

US 2013/0228863 A1 Sep. 5, 2013

(30) Foreign Application Priority Data

Mar. 2, 2012 (CN) .......................... 2012 1 0053862

(51) Int. Cl.
| | |
|---|---|
| H01L 21/20 | (2006.01) |
| H01L 29/78 | (2006.01) |
| H01L 29/66 | (2006.01) |
| H01L 21/02 | (2006.01) |
| H01L 27/12 | (2006.01) |
| H01L 21/84 | (2006.01) |

(52) U.S. Cl.
CPC ...... *H01L 29/66795* (2013.01); *H01L 21/0262* (2013.01); *H01L 21/02381* (2013.01); *H01L 21/02532* (2013.01); *H01L 21/02639* (2013.01); *H01L 21/84* (2013.01); *H01L 27/1203* (2013.01); *H01L 29/785* (2013.01)

(58) Field of Classification Search
CPC ............ H01L 21/845; H01L 29/66795; H01L 21/823412; H01L 29/7851; H01L 29/66818
USPC ......................................................... 438/283
See application file for complete search history.

(56) References Cited

U.S. PATENT DOCUMENTS

| | | | |
|---|---|---|---|
| 6,331,470 B1 * | 12/2001 | Sanfilippo et al. ............ | 438/311 |
| 6,864,164 B1 * | 3/2005 | Dakshina-Murthy et al. .............................. | 438/585 |
| 7,868,380 B2 | 1/2011 | Kim et al. | |
| 7,960,791 B2 * | 6/2011 | Anderson et al. ............. | 257/349 |
| 2005/0077553 A1 * | 4/2005 | Kim et al. ...................... | 257/288 |
| 2006/0115947 A1 * | 6/2006 | Cheng et al. ................... | 438/283 |
| 2007/0004107 A1 | 1/2007 | Lee et al. | |
| 2008/0206934 A1 * | 8/2008 | Jones et al. .................... | 438/151 |
| 2008/0318375 A1 * | 12/2008 | Van Noort et al. ............ | 438/212 |

* cited by examiner

*Primary Examiner* — Colleen A Matthews
*Assistant Examiner* — Regan J Rundio
(74) *Attorney, Agent, or Firm* — Anova Law Group, PLLC

(57) ABSTRACT

A fin field effect transistor (FET) including a fin structure and a method for forming the fin FET are provided. In an exemplary method, the fin FET can be formed by forming at least one fin seed, including a top surface and sidewalls, on a substrate. A first semiconductor layer can then be formed at least on the sidewalls of the at least one fin seed. A second semiconductor layer can be formed on the first semiconductor layer. The second semiconductor layer and the at least one fin seed can be made of a same material. The first semiconductor layer can be removed to form a fin structure including the at least one fin seed and the second semiconductor layer.

18 Claims, 4 Drawing Sheets

FIN FIELD EFFECT TRANSISTOR AND FABRICATION METHOD

CROSS REFERENCE TO RELATED APPLICATIONS

This application claims priority to Chinese patent application No. 201210053862.1, filed on Mar. 2, 2012 and entitled "METHOD FOR FORMING FIN STRUCTURE AND METHOD FOR FORMING FIN FIELD EFFECT TRANSISTOR", the entire disclosure of which is incorporated herein by reference.

FIELD OF THE DISCLOSURE

The present disclosure generally relates to the field of semiconductor manufacturing and, more particularly, to a method for forming a fin structure and a method for forming a fin field effect transistor (Fin FET).

BACKGROUND OF THE DISCLOSURE

Fin field effect transistors (FETs) are multi-gate devices which are widely used nowadays. FIG. 1 is a perspective view of a common type of Fin FET. As shown in FIG. 1, the Fin FET includes a substrate 10 and a fin structure 14 protruding from the substrate 10. A dielectric layer 11 is disposed to cover the substrate 10 on opposite sides of the fin structure 14 and a portion of sidewalls of the fin structure 14. A gate structure 12, including a gate dielectric layer and a gate electrode layer (not shown in FIG. 1), is disposed on the dielectric layer 11. The gate structure 12 stretches over the fin structure 14, partially covering the top surface and sidewalls of the fin structure 14. A source region and a drain region are respectively disposed within the fin structure 14 on opposite sides of gate structure 12. On the top surface and sidewalls of the fin structure 14, several regions are in contact with the gate structure 12. Therefore, multiple channel regions are formed, which may increase the drive current of the Fin FET and improve the device performance.

Conventionally, the fin structure 14 is formed by employing a lithographic process. With development of semiconductor technologies, devices and their critical dimensions are shrinking. It is therefore desirable to have high fin density of a compact device for increasing the drive current of the compact device. A high fin density means there are more fins included, and large drive current may be obtained. However, the fin density is limited by current lithographic resolution.

Therefore, there is a need to provide a fin FET including a fin structure and a method for forming the fin FET with an increased fin density.

SUMMARY

The present disclosure provides a fin FET and a method for forming the fin FET with an increased fin density.

According to various embodiments, there is provided a method for forming a fin FET. The fin FET can be formed by forming at least one fin seed, including a top surface and sidewalls, on a substrate. A first semiconductor layer can then be formed at least on the sidewalls of the at least one fin seed. A second semiconductor layer can be formed on the first semiconductor layer. The second semiconductor layer and the at least one fin seed can be made of a same material. The first semiconductor layer can be removed to form a fin structure including the at least one fin seed and the second semiconductor layer.

According to various embodiments, there is provided a fin FET. The fin FET can include a fin structure formed on a substrate. The fin structure can include at least one fin seed and a semiconductor component. The fin structure is formed by forming at least one fin seed, including a top surface and sidewalls, on a substrate. A first semiconductor layer can be formed at least on the sidewalls of the at least one fin seed. A second semiconductor layer can be formed on the first semiconductor layer. The second semiconductor layer and the at least one fin seed can be made of a same material. The first semiconductor layer can be removed to form the fin structure. The fin structure can include the at least one fin seed and the semiconductor component including the second semiconductor layer.

The at least one fin seed may be formed by a lithographic process, the fin density of the at least one fin seed is therefore determined by resolution of the lithographic process. By forming the semiconductor component, e.g., thin films, using epitaxial processes, the fin density of the fin structure can be increased.

Other aspects or embodiments of the present disclosure can be understood by those skilled in the art in light of the description, the claims, and the drawings of the present disclosure.

DETAILED DESCRIPTION OF THE DISCLOSURE

Figure 1:
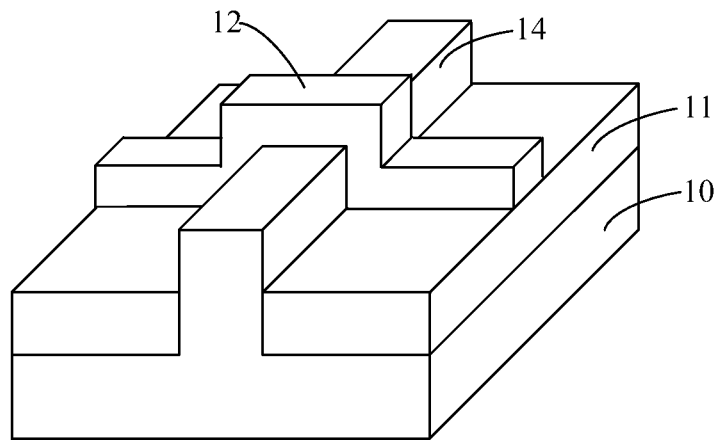
FIG. 1 is a perspective view of a conventional Fin FET.

Reference will now be made in detail to exemplary embodiments of the disclosure, which are illustrated in the accompanying drawings. Wherever possible, the same reference numbers will be used throughout the drawings to refer to the same or like parts. For illustration purposes, elements illustrated in the accompanying drawings are not drawn to scale, which are not intended to limit the scope of the present disclosure. In practical operations, each element in the drawings has specific dimensions such as a length, a width, and a depth.

Figure 2:
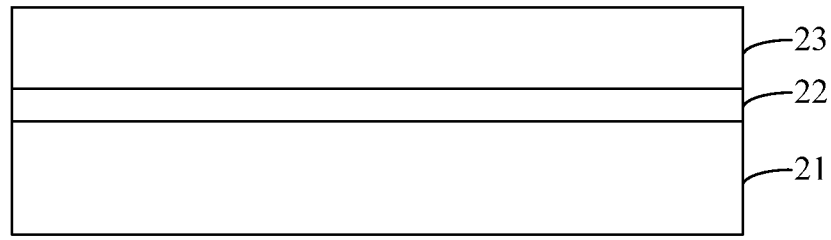
FIGS. 2-3 are cross-sectional views of intermediate structures illustrating a process for forming a fin structure on a SOI (i.e., silicon on insulator) substrate.
Figure 3:
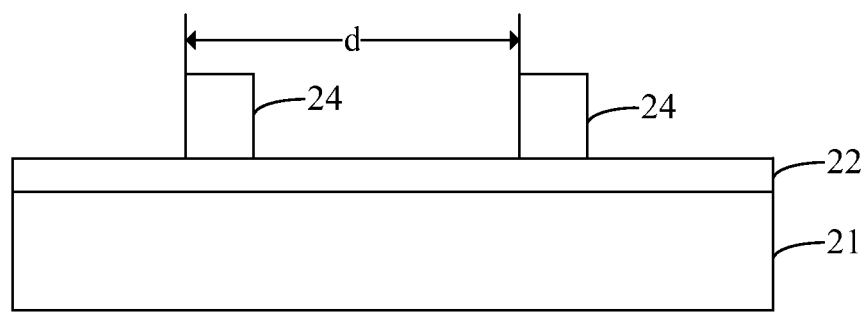

FIGS. 2-3 are cross-sectional views of intermediate structures illustrating a process for forming a fin structure on a SOI substrate using a conventional lithographic process. As shown in FIG. 2, a SOI substrate is provided. The SOI substrate includes a bottom layer 21, a buried layer 22, and a top layer 23. Then, a patterned photoresist layer (not shown in FIG. 2) is formed on the top layer 23. The top layer 23 shown in FIG. 2 is etched using the patterned photoresist layer as an etch mask to form fins 24. After formation of the fins 24, a gate structure, a source, and a drain may be formed to form a Fin FET.

The patterned photoresist layer is formed using a lithographic process. The pattern of the photoresist layer is then transferred to the top layer 23 (shown in FIG. 2) to form the fins 24 (shown in FIG. 3). Fin density is therefore limited by resolution of the lithographic process. As shown in FIG. 3, conventional methods using only the lithographic process may lead to a broad fin pitch "d", resulting in a low fin density. Due to the low fin density, the resulting Fin FET may not have a desired drive current.

Figure 4:
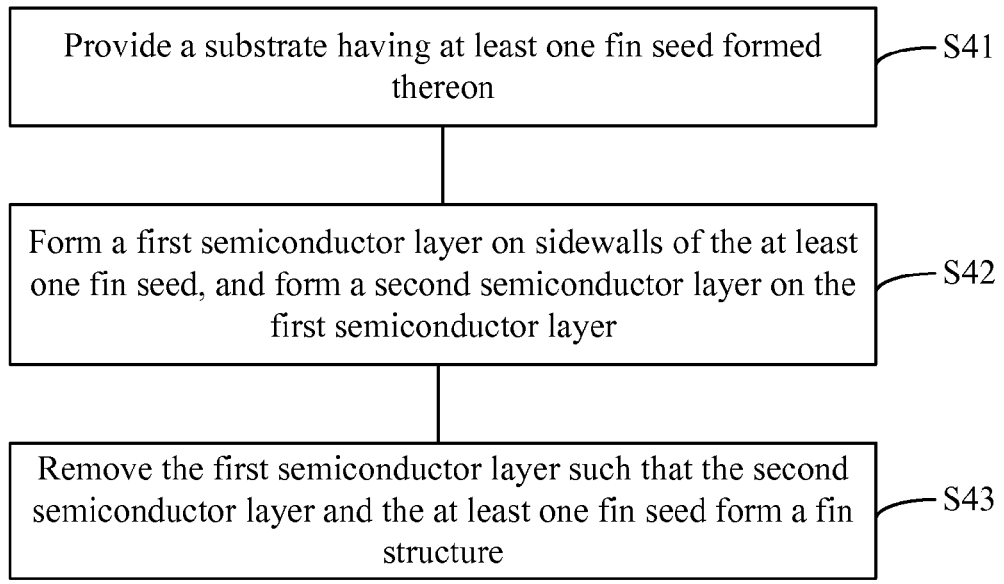
FIG. 4 is a flow chart of an exemplary method for forming a fin structure according to various disclosed embodiments.

FIG. 4 depicts an exemplary method for forming a fin structure according to an embodiment of the present disclosure. The fin structure is formed providing an increased fin density. For example, the method in FIG. 4 is described in great details with reference to intermediate structures shown in FIGS. 5-12.

Figure 6:
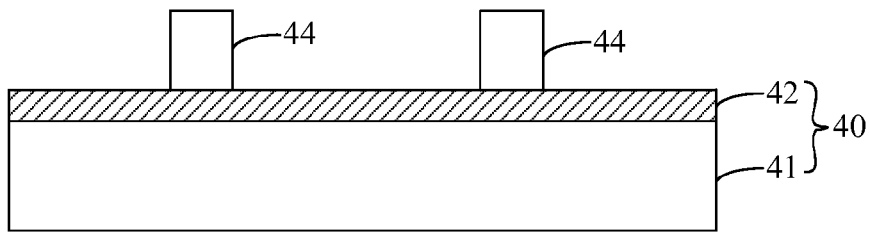

In Step S41 of FIG. 4 and referring to FIG. 6, a substrate 40 is provided having at least one fin seed 44 formed thereon. The at least one fin seed 44 constitutes a portion of a fin structure to be formed. The substrate 40 includes a bottom layer 41 and a buried layer 42 over the bottom layer 41. The bottom layer 41 and the at least one fin seed 44 may include, but be not limited to, monocrystalline silicon, monocrystalline germanium, monocrystalline SiGe, a group compound, monocrystalline SiC, or the like. The buried layer 42 may include silicon oxide, or other suitable dielectric materials.

Figure 5:
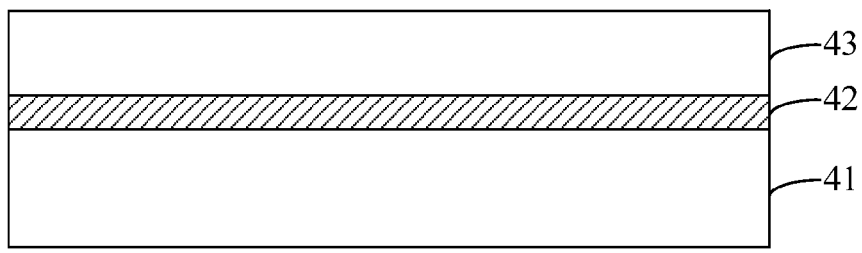
FIGS. 5-9 and 11-12 are cross-sectional views of intermediate structures illustrating a process for forming a Fin FET structure according to various disclosed embodiments.

For example, the substrate 40 having the at least one fin seed 44 thereon may be formed by using a SOI substrate. The SOI substrate can provide leakage current suppression to a subsequently-formed fin FET. As shown in FIG. 5, the SOI substrate includes: a bottom layer 41, a buried layer 42 on the bottom layer 41, and a top layer 43 on the buried layer 42. The buried layer 42 and the bottom layer 41 constitute the substrate 40.

The top layer 43 is patterned using a lithographic process followed by an etching process to form a structure shown in FIG. 6 including the at least one fin seed 44 on the buried layer 42. The top layer 43 may include, for example, monocrystalline silicon, monocrystalline germanium, monocrystalline SiGe, a III-V group compound, monocrystalline SiC, or the like. The top layer 43 in FIG. 5 may be patterned by any suitable techniques other than lithographic and etching, which should not be limited according to various disclosed embodiments.

It should be noted that one or more fin seeds can be formed by patterning the top layer, although only two of them are shown in FIG. 6 for illustration purposes. Subsequently, various structures can be formed on a top surface and sidewalls of the at least one fin seed 44.

Referring back to FIG. 6, the substrate 40 having the at least one fin seed 44 thereon may be formed in other ways. In another embodiment, a bulk silicon substrate may be provided, and then a lithographic process and an etching process may be performed on a top portion of the bulk silicon substrate to form the at least one fin seed 44. The remaining portion of the bulk silicon substrate constitutes the substrate.

Figure 7:
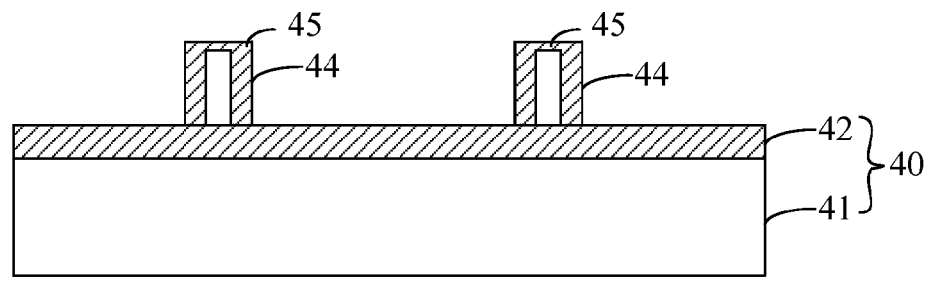

Optionally, a thinning process may be performed to reduce dimensions of the at least one fin seed 44. Referring to FIG. 7, an oxide layer 45 is formed by oxidizing a top surface and sidewalls of the at least one fin seed 44. For example, a dry oxidation process (e.g., oxidizing surfaces of the at least one fin seed 44 by supplying oxygen) or a wet oxidation process (e.g., oxidizing surfaces of the at least one fin seed 44 by supplying water vapor) can be performed at a processing temperature. The processing temperature of the oxidation processes can be selected from a broad range, for example, from about 700° C. to about 1200° C. Generally, the higher processing temperature, the faster oxidation speed. For example, the thickness of the oxide layer 45 can be adjusted by controlling the oxidation processing conditions (e.g., the processing temperature, time, etc.). Accordingly, a width "W" and/or a thickness of the thinned at least one fin seed 44 are controllably reduced.

Figure 8:
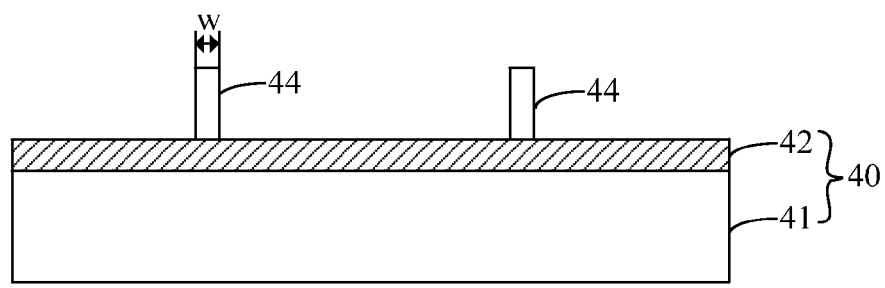

The oxide layer 45 shown in FIG. 7 can then be removed, e.g., by a wet etching, to form the thinned at least one fin seed 44 as shown in FIG. 8 with reduced width "W" and/or with reduced thickness.

As used herein, a bottom surface of a component is a surface of the component in contact with an underlying substrate, a top surface of the component is a surface opposite to the bottom surface, and sidewalls of the component are other surfaces between the top surface and the bottom surface of the component. In various embodiments, forming a layer over a surface of a component includes the layer formed on or in the top surface and sidewalls of the component.

In various embodiments, formation of the thinned at least one fin seed 44 as shown in FIG. 8 with reduced width "W" and/or with reduced thickness is especially demanded when the original width of the at least one fin seed is unacceptably large.

Figure 11:
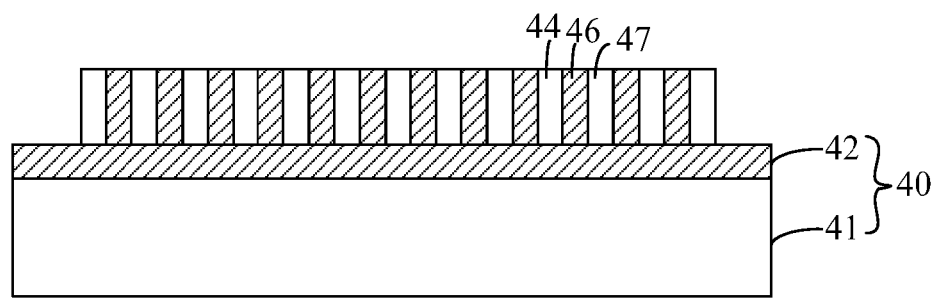

In Step S42 of FIG. 4 and referring to FIG. 11, at least one first semiconductor layer 46 and at least one second semiconductor layer 47 are alternatingly formed on sidewalls of the at least one fin seed 44, e.g., using epitaxial processes. The second semiconductor layers 47 and the at least one fin seed 44 (either thinned or un-thinned) may be made of a same material. In a specific embodiment, the first semiconductor layers 46 include monocrystalline SiGe, and the second semiconductor layers 47 include monocrystalline Si.

The at least one fin seed 44 may include multiple fins formed in parallel with each other. The fins can extend from the substrate 40 having a same extending direction. In various embodiments, sidewalls of the at least one fin seed are parallel to the extending direction.

Figure 9:
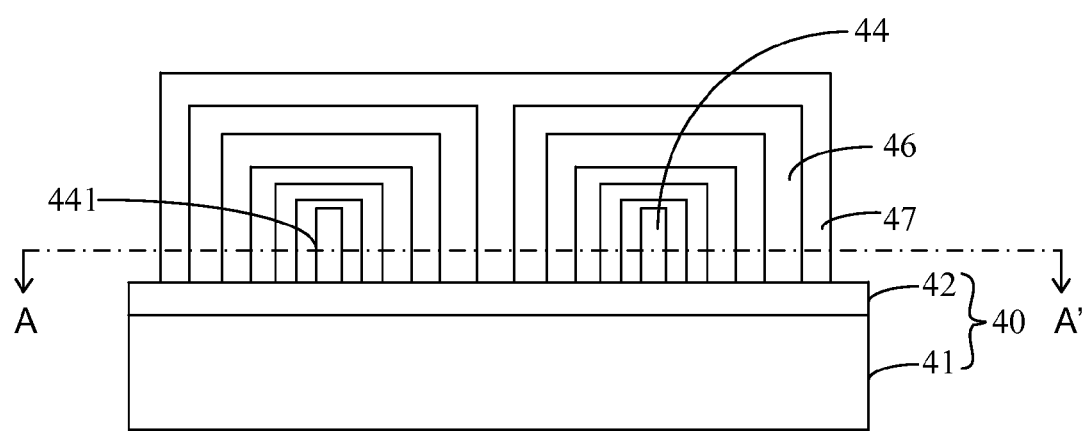

In an exemplary embodiment, the structure shown in FIG. 11 can be formed as follows. Referring to FIG. 9, the first semiconductor layers 46 and second semiconductor layers 47 are alternatingly formed over each exemplary fin of the at least one fin seed 44 by epitaxial processes. In one embodiment, a first semiconductor layers is formed over a top surface and sidewalls of each exemplary fin of the at least one fin seed 44 using an epitaxial process. This can be followed by forming a second semiconductor layer over the first semiconductor layer using an epitaxial process. In various embodiments, such process of alternatingly forming a first and a second semiconductor layer can be repeated as desired to form a plurality of first and second semiconductor layers as shown in FIG. 9. The specific number of the first and second semiconductor layers to be formed can depend on practical requirements.

Figure 10:
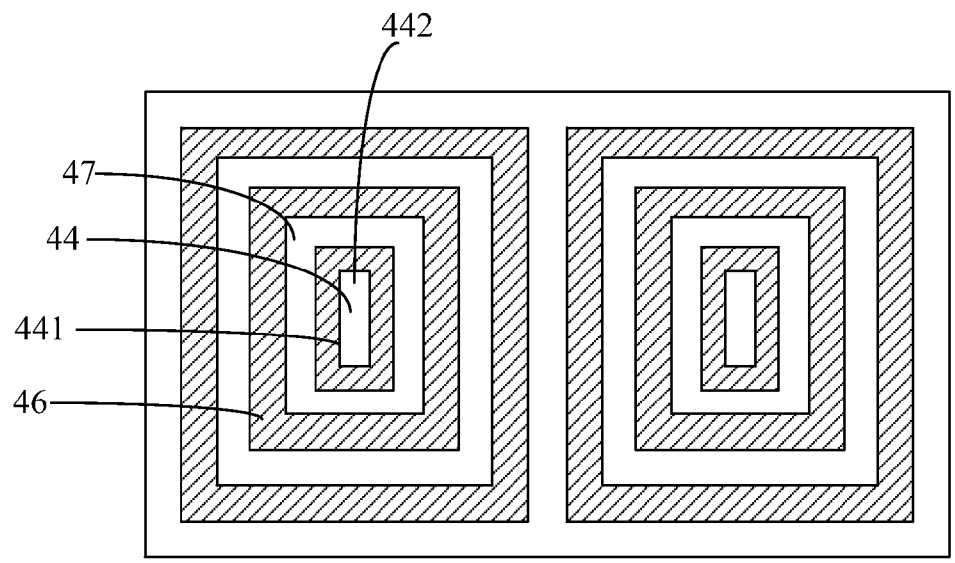
FIG. 10 is a cross-sectional top view along an A-A' direction of the structure shown in FIG. 9 according to various disclosed embodiments.

FIG. 10 is a cross-sectional top view along an A-A' direction of the structure shown in FIG. 9. As shown in FIGS. 9-10, the first and second semiconductor layers are formed around each fin of the at least one fin seed 44, e.g., on sidewalls 441 as shown in FIG. 9 (which are parallel to the extending direction of the fins) and on a top surface 442 of each fin as shown in FIG. 10. It should be noted that although only those portions of the first and second semiconductor layers on the sidewalls 441 are subsequently utilized to form fins, other portions of the first and second semiconductor layers on the top surface 442 can be maintained thereon without adversely affecting the device performance. Optionally, the portions on the top surface 442 may be removed by an etching process.

Referring to FIG. 11, the first semiconductor layer 46 and the second semiconductor layer 47 are polished and planarized to expose the at least one fin seed 44, so that top surfaces of the first semiconductor layers 46 and the second semiconductor layers 47 can be leveled with the top surface of the at least one fin seed 44. For example, portions of the first semiconductor layers 46 and the second semiconductor layers 47 that are above the at least one fin seed 44 can be removed, e.g., by a chemical mechanical polishing (CMP) process, to expose the at least one fin seed 44. In various embodiments, other polishing and/or planarization processes may be performed without limitation.

In other embodiments, the first semiconductor layers 46 and the second semiconductor layer 47 formed on sidewalls of the at least one fin seed 44 as shown in FIG. 11, can be formed in many other ways. For example, lateral epitaxial processes may be used to form the first and second semiconductor layers only on sidewalls of each fin of the at least one fin seed 44 (e.g., without being formed on the top surface of the at least one fin seed 44). In this case, the planarization process can be optionally omitted. For example, a hard mask layer may be formed on the top surface 442 shown in FIG. 10 (e.g., which are not parallel to the extending direction) of the at least one fin seed 44 to form the first and second semiconductor layers only on the sidewalls 441 (shown in FIG. 9) of the at least one fin seed 44 using lateral epitaxial processes. After that, the hard mask layers are removed.

Figure 12:
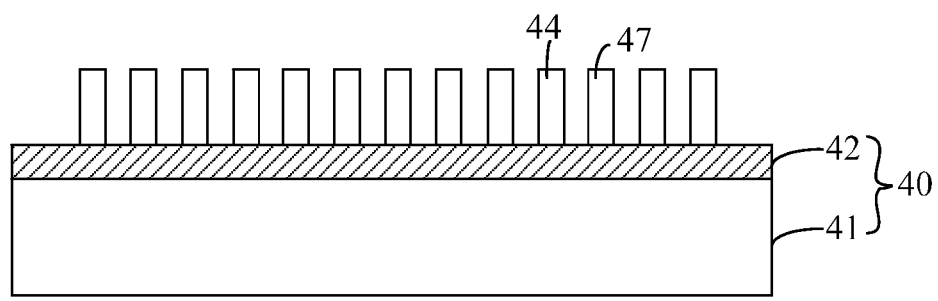

In Step S43 of FIG. 4 and referring to FIG. 12, the first semiconductor layers 46 (shown in FIG. 11) are removed. The second semiconductor layers 47 are remained to form a semiconductor component of the fin structure. The fin structure includes the at least one fin seed and the semiconductor component.

In a specific embodiment, removing the first semiconductor layers is to remove remaining first semiconductor layers after planarization, remaining portions of the second semiconductor layers after planarization constitute the semiconductor component. The at least one fin seed together with the semiconductor component constitute the fin structure. Removing the planarized first semiconductor layers may be performed by employing a wet etching process or a dry etching process which has a relatively high selectivity over the second semiconductor layers.

In this manner, the fin structure includes the at least one fin seed and the semiconductor component. The at least one fin seed may be formed using a lithograph process with undesirable fin density limited by resolution of the lithograph process. As disclosed herein, the semiconductor component is formed using the epitaxial processes in which first and second semiconductor layers are alternatingly formed on sidewalls of the at least one fin seed. The first semiconductor layers are removed, and the second semiconductor layers constitute the semiconductor component. The fin density of the semiconductor component may be increased because the epitaxial processes can form thin films without being limited by the resolution of the lithograph process.

The present disclosure further provides a method for forming a Fin FET. The method includes: forming a fin structure as described above, and then forming a gate structure, a source and a drain. Any suitable formation processes of the gate structure, the source and the drain can be included herein.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. A method for forming a fin field effect transistor, comprising:
   providing a substrate comprising a buried layer on a semiconductor layer;
   forming at least one fin seed directly on the buried layer of the substrate, wherein the at least one fin seed comprises a top surface and sidewalls;
   forming a first semiconductor layer on the top surface and the sidewalls of the at least one fin seed;
   forming a second semiconductor layer on a top surface and sidewalls of the first semiconductor layer, and on the buried layer, wherein the second semiconductor layer and the at least one fin seed is made of a same material;
   performing a fabrication cycle at least once, the fabrication cycle comprising:
      alternately forming a third semiconductor layer made of a same material as the first semiconductor layer, on the second semiconductor layer; and
      forming a fourth semiconductor layer made of a same material as the second semiconductor layer, on the third semiconductor layer, and
      wherein each of the third semiconductor layer and the fourth semiconductor layer are formed directly on the buried layer;
   exposing each of the at least one fin seed, the first semiconductor layer, the second semiconductor layer, the third semiconductor layer, and the fourth semiconductor layer by polishing and planarizing; and
   completely removing the first semiconductor layer and the third semiconductor layer to form a fin structure comprising the at least one fin seed, the second semiconductor layer, and the fourth semiconductor layer, in the fin field effect transistor,
   wherein the second semiconductor layer is around the at least one fin seed to enclose the at least one fin seed, and the fourth semiconductor layer is around the second semiconductor layer to enclose the second semiconductor layer.

2. The method according to claim 1, further comprising:
   epitaxially growing the first semiconductor layer on the top surface and the sidewalls of the at least one fin seed; and
   polishing each of the first semiconductor layer and the second semiconductor layer to expose the at least one fin seed, wherein the polishing further planarizes the first and second semiconductor layers to have a top surface level with a top surface of the exposed at least one fin seed.

3. The method according to claim 1, wherein, before forming the first and second semiconductor layers, the method further comprises a thinning process comprising:
   oxidizing the top surface and a surface of the sidewalls of the at least one fin seed to form an oxidized layer thereon; and
   removing the oxidized layer by a wet etching to form a thinned fin seed.

4. The method according to claim 3, wherein the oxidizing comprises a wet oxidization process or a dry oxidization process.

5. The method according to claim 3, further comprising controlling a thickness of the thinned fin seed by controlling a thickness of the oxidized layer.

6. The method according to claim 1, wherein the first semiconductor layer comprises monocrystalline SiGe, and the second semiconductor layer comprises monocrystalline Si.

7. The method according to claim 1, wherein the removing of the first semiconductor layer and the third semiconductor layer employs an etching process comprising a wet etching process or a dry etching process.

8. The method according to claim 1, wherein the semiconductor layer is made of silicon and the buried layer comprises an oxide layer.

9. The method according to claim 1, wherein the at least one fin seed is made of a material comprising monocrystalline silicon, monocrystalline germanium, monocrystalline SiGe, a III-V group compound, or monocrystalline SiC.

10. The method according to claim 1, wherein providing the substrate and forming the at least one fin seed on the substrate are performed by:
   providing a silicon-on-insulator substrate comprising a bottom layer, a buried layer on the bottom layer, and a top layer on the buried layer; and
   patterning the top layer to form the at least one fin seed, wherein the buried layer and the bottom layer constitute the substrate.

11. The method according to claim 10, wherein the bottom layer comprises monocrystalline Si; the top layer comprises monocrystalline Si; and the buried layer comprises silicon oxide.

12. The method according to claim 10, wherein patterning the top layer is performed using a lithographic process and an etching process.

13. The method according to claim 1, wherein the first, second, third, and fourth semiconductor layers increase a fin density of the fin structure.

14. A fin field effect transistor, comprising:
   a substrate comprising a buried layer on a semiconductor layer;
   a fin structure disposed directly on the buried layer of the substrate, the fin structure comprising at least one fin seed and a semiconductor component, wherein the fin structure is formed by:
   forming the at least one fin seed directly on the buried layer of the substrate, wherein the at least one fin seed has a top surface and sidewalls; forming a first semiconductor layer on the top surface and the sidewalls of the at least one fin seed; forming a second semiconductor layer on a top surface and sidewalls of the first semiconductor layer, and on the buried layer, wherein the second semiconductor layer and the at least one fin seed are made of a same material; and performing a fabrication cycle at least one, the fabrication cycle comprising:
   alternately forming a third semiconductor layer made of a same material as the first semiconductor layer, on the second semiconductor layer; and
   forming a fourth semiconductor layer made of a same material as the second semiconductor layer, on the third first semiconductor layer, and
   wherein each of the third semiconductor layer and the fourth semiconductor layer are formed directly on the buried layer;
   exposing each of the at least one fin seed, the first semiconductor layer, the second semiconductor layer, the third semiconductor layer, and the fourth semiconductor layer by polishing and planarizing; and
   completely removing the first semiconductor layer and the third semiconductor layer to form a fin structure comprising the at least one fin seed, the second semiconductor layer, and the fourth semiconductor layer, in the fin field effect transistor,
   wherein the second semiconductor layer is around the at least one fin seed to enclose the at least one fin seed, and the fourth semiconductor layer is around the second semiconductor layer to enclose the second semiconductor layer.

15. The transistor according to claim 14, wherein the at least one fin seed comprises a thinned fin seed by an oxidation process to form an oxidized layer and a removal of the oxidized layer.

16. The transistor according to claim 14, wherein the first semiconductor layer is made of a material having an etching selectivity over the second semiconductor layer.

17. The transistor according to claim 14, wherein the second semiconductor layer is made of a material comprising monocrystalline silicon, monocrystalline germanium, monocrystalline SiGe, a III-V group compound, or monocrystalline SiC.

18. The transistor according to claim 14, wherein the semiconductor layer is made of silicon and the buried layer comprises an oxide layer.

* * * * *